(12) United States Patent
Theel

(10) Patent No.: US 7,082,050 B2
(45) Date of Patent: Jul. 25, 2006

(54) METHOD TO EQUALIZE WORD CURRENT CIRCUITRY

(75) Inventor: Wayne Theel, Plymouth, MN (US)

(73) Assignee: Union Semiconductor Technology Corporation, Plymouth, MN (US)

( * ) Notice: Subject to any disclaimer, the term of this patent is extended or adjusted under 35 U.S.C. 154(b) by 122 days.

(21) Appl. No.: 10/724,985

(22) Filed: Nov. 30, 2003

(65) Prior Publication Data

US 2005/0117385 A1 Jun. 2, 2005

(51) Int. Cl.
G11C 11/00 (2006.01)

(52) U.S. Cl. .................. 365/158; 365/203; 365/209; 365/230.06

(58) Field of Classification Search ............ 365/158 O, 365/203 X, 206, 209 X, 230.06 X
See application file for complete search history.

(56) References Cited

U.S. PATENT DOCUMENTS

| | | | |
|---|---|---|---|
| 5,946,227 A | 8/1999 | Naji | |
| 6,246,630 B1 * | 6/2001 | Hosokawa et al. | .... 365/230.06 |
| 6,341,084 B1 * | 1/2002 | Numata et al. | ............. 365/158 |
| 6,385,111 B1 | 5/2002 | Tran et al. | |
| 6,407,946 B1 | 6/2002 | Maruyama et al. | |
| 6,590,804 B1 | 7/2003 | Perner | |
| 6,674,679 B1 | 1/2004 | Perner et al. | |
| 6,683,816 B1 | 1/2004 | Chan et al. | |
| 6,700,814 B1 | 3/2004 | Nahas et al. | |
| 6,790,874 B1 | 9/2004 | Tran et al. | |
| 6,795,340 B1 * | 9/2004 | Sakimura et al. | ........... 365/171 |
| 6,803,615 B1 | 10/2004 | Sin et al. | |
| 6,804,144 B1 | 10/2004 | Iwata | |
| 6,834,017 B1 | 12/2004 | Perner et al. | |
| 6,873,543 B1 | 3/2005 | Smith et al. | |
| 2004/0085122 A1 | 5/2004 | Perner et al. | |
| 2004/0228170 A1 | 11/2004 | Brennan et al. | |
| 2005/0083748 A1 | 4/2005 | Lemus et al. | |

* cited by examiner

*Primary Examiner*—VanThu Nguyen
(74) *Attorney, Agent, or Firm*—Jones Day (57) ABSTRACT

A magnetic random access memory (10) with equalization has a plurality of magnetic memory elements that perform a memory operation. A word line magnetically activates at least one magnetic memory element. A sense line detects the state of the at least one magnetic memory element. A word line driver is connected to the word line to drive a current on the word line during the memory operation. A word line equalizer is connected to the word line to equalize the word line during the non-memory operations.

12 Claims, 10 Drawing Sheets

METHOD TO EQUALIZE WORD CURRENT CIRCUITRY

This application is related to co-pending patent applications 10/724,983, 10/724,984, 10/724,986 and 10/724,987, each of which was filed on Nov. 30, 2003.

FIELD OF THE INVENTION

The present invention relates to a magnetic random access memory and more particularly to a magnetic random access memory having a method to equalize word current circuitry.

BACKGROUND OF THE INVENTION

Typical Magnetic Random Access Memory (MRAM) structures have a nonmagnetic layer sandwiched between two ferromagnetic films. The two ferromagnetic films are also known as magnetic thin films. The MRAM employs the magneto resistive properties of this structure to store data. In each storage element, an MRAM employs two lines, commonly termed a word line and a sense string, in order to detect the magnetization direction of these magnetic thin films. Each string comprises a magnetic thin film that serves as a memory element, and the word line generally addresses multiple sense strings. Magnetic thin films that have a parallel moment have a low resistance and are typically assigned the '1' state. Magnetic thin films having an anti-parallel moment have a high resistance and are typically assigned the '0' state, but may also be assigned to the '1' state.

During a read operation, a word current passes through the word line causing the magnetic layers in the sense string to rotate, thereby changing the resistance in the sense string. A sense current passes through the sense string. A sense line receives the signal from the sense string. A differential amplifier compares the signal from the sense line to a reference line to determine whether a one resistance or a zero resistance is stored in the MRAM. A differential amplifier notes the change in voltage across the sense line to determine resistive state of a storage element.

MRAM word lines have relatively large capacitances; carry large currents and switch in a short time period. During operation, an MRAM requires stable voltage changes when switching highly capacitive high current word lines. If stability is not achieved, then undesirable current surges may adversely affect memory operations causing an unstable read and write cycle. When the word line switch is activated, an undesired current pulse may be generated. This could have the result of creating a false or unexpected write to the memory cell being selected.

Other workers have devised solutions that involve using decoding schemes that do not address the need for smooth and stable changes to word line signals. They ignore these changes and all switching control is attempted with the controlling logic circuitry.

Therefore, there is a need to equalize voltage on either side of the word decode circuit prior to the start of a read or write cycle.

There is a further need to reduce undesirable current surges on the word lines.

There is a further need to provide greater control of the read and write current and the associated read and write magnetic fields.

There is a further need to provide a more stable read and write cycle.

SUMMARY

The present invention solves these needs and other problems in the field of word current equalization methods by providing, in most preferred aspects, a word line equalization circuit comprising: an output; and a current output.

In further aspects, the invention provides a current controlled word current source comprising: a current source having a stable reference current output; and a word current source having a word current reference input connected to the stable reference current output with the word current source having a word current output.

The present invention will become clearer in light of the following detailed description of an illustrative embodiment of this invention described in connection with the drawings.

DESCRIPTION OF THE DRAWINGS

The illustrative embodiment may best be described by reference to the accompanying drawings where.

All figures are drawn for ease of explanation of the basic teachings of the present invention only; the extensions of the figures with respect to number, position, relationship, and dimensions of the parts to form the preferred embodiment will be explained or will be within the skill of the art after the following description has been read and understood. Further, the exact dimensions and dimensional proportions to conform to specific current, force, voltage, weight, strength, and similar requirements will likewise be within the skill of the art after the following description has been read and understood.

Where used in the various figures of the drawings, the same numerals designate the same or similar parts. Furthermore, when the terms "side," "end," "bottom," "first," "second," "laterally," "longitudinally," "row," "column," and similar terms are used herein, it should be understood that these terms have reference only to the structure shown in the drawings as it would appear to a person viewing the drawings and are utilized only to facilitate describing the illustrative embodiment.

DESCRIPTION OF THE PREFERRED EMBODIMENTS

Figure 1:
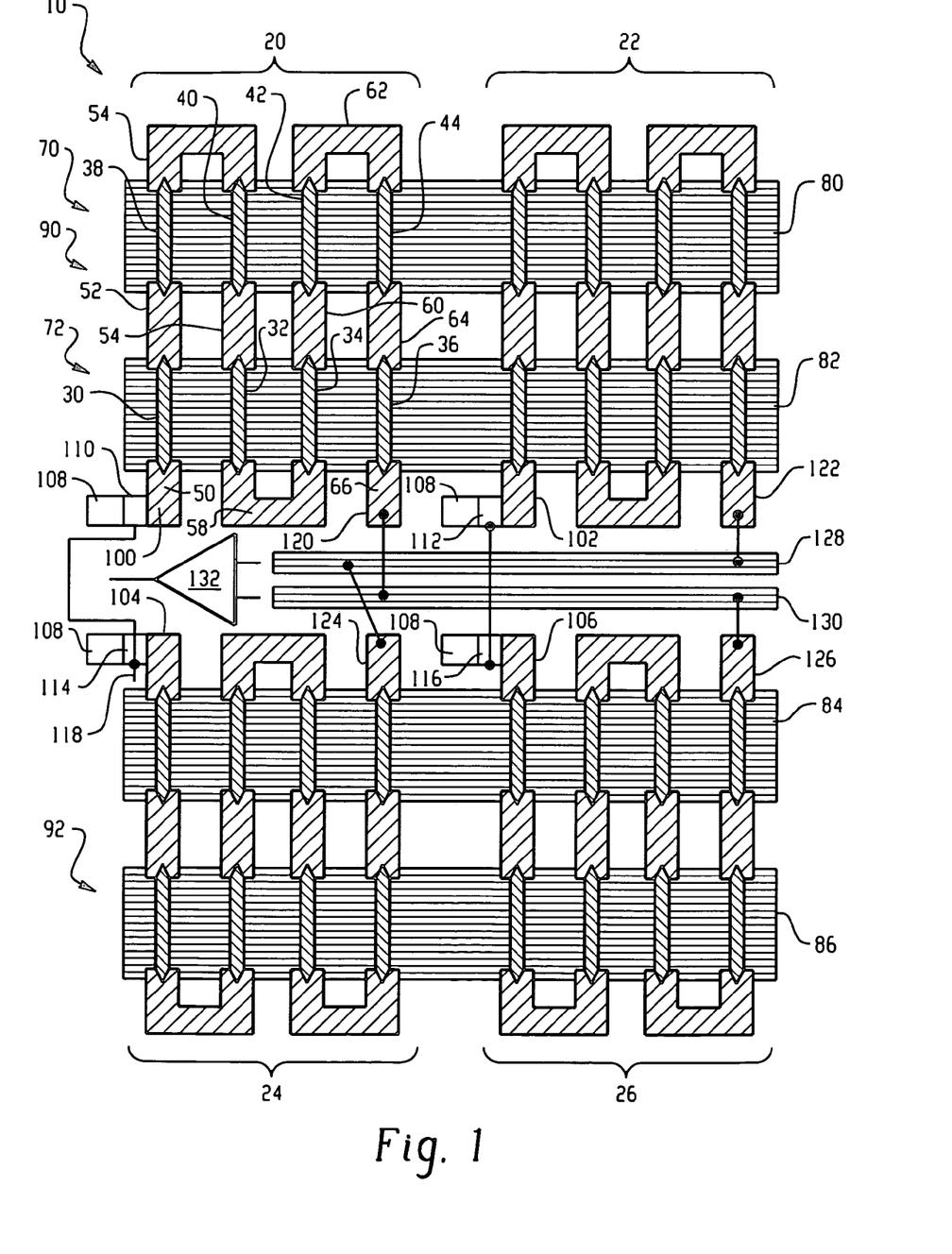
FIG. 1 shows a top view of an MRAM segment utilizing preferred methods according to the preferred teachings of the present invention, with portions of the MRAM structure removed to show details of the noise stabilization and reduction apparatus of the present invention.

A top view of an MRAM segment having a signal size increasing apparatus in a sensing operation of MRAM, according to the preferred teachings of the present invention, is shown in FIG. 1 and is generally designated 10. Portions of the MRAM structure shown in FIG. 1 have been removed to show details of the signal size increasing apparatus of the present invention. Those skilled in the art will be aware that MRAM chips contain other structures and layers, such as a transistor layer that may be formed from polysilicon and a metal connect layer. These elements have been removed for the sake of clarity.

The MRAM segment includes a plurality of sense strings 20, 22, 24, 26. Each sense string 20, 22, 24, 26 includes one or more sub bits 30, 32, 34, 36, 38, 40, 42, 44 connected by strap layer segments 50, 52, 54, 56, 58, 60, 62, 64, 66. In the preferred embodiment of the present invention, the strap layer segments 50, 52, 54, 56, 58, 60, 62, 64, 66 connect the sub bits 30, 32, 34, 36, 38, 40, 42, 44 in series. In further aspects of the preferred embodiment, the structure of the sense strings 20, 22, 24, 26 have a serpentine conformation. In this conformation, groups of two sub bits 30, 32, 34, 36, 38, 40, 42, 44 form linear components. The strap layer segments 50, 52, 54, 56, 58, 60, 62, 64, 66 provide connection elements to join the sub bits 30, 32, 34, 36, 38, 40, 42, 44 into these linear components. Four of these linear components are located parallel to one another. The strap layer segments 50, 52, 54, 56, 58, 60, 62, 64, 66 also provide connection elements to join the linear components at alternating ends in order to connect the sub bits 30, 32, 34, 36, 38, 40, 42, 44 in series. In the preferred embodiment, the sense strings 20, 22, 24, 26 include eight sub bits 30, 32, 34, 36, 38, 40, 42, 44 connected in series. In an alternative embodiment, the sense strings 20, 22, 24, 26 may make up a single sub bit. Different numbers of sub bits and as well as different arrangements of the sub bits may be employed without departing from the spirit and scope of the invention.

The sub bits 30, 32, 34, 36, 38, 40, 42, 44 include the data storage element of the MRAM segment 10. These sub bits 30, 32, 34, 36, 38, 40, 42, 44 may also be termed "memory spots" or "memory elements". In the preferred embodiment, the sub bits or memory spots 30, 32, 34, 36, 38, 40, 42, 44 are grouped in fours, where the upper four memory spots 38, 40, 42, 44 make up an upper bit 70 and the lower four memory spots 30, 32, 34, 36 make up a lower bit 72.

The MRAM segment 10 employs a word line 80, 82, 84, 86 to address a selected bit 70, 72. In the preferred embodiment, the MRAM segment 10 uses two word lines 80, 82 to address the sense strings 20, 22, 24, 26, with an upper word line 80 addressing the memory spots 38, 40, 42, 44 of the upper bit 70 and a lower word line 82 addressing the memory spots 30, 32, 34, 36 of the lower bit 72. The upper word line 80 intersects each of the upper sub bits 38, 40, 42, 44 so that a sense current passing through the upper sub bits 38, 40, 42, 44 is orthogonal to a word current passing through the upper word line 80. Likewise, the lower word line 82 intersects each of the lower sub bits 30, 32, 34, 36 so that a sense current passing through the lower sub bits 30, 32, 34, 36 is orthogonal to a word current passing through the lower word line 82. Serial connection of the memory spots 30, 32, 34, 36, 38, 40, 42, 44 combined with activation of the word line 80, 82, 84, 86 corresponding to a selected bit 70, 72 allows each sub bit 30, 32, 34, 36, 38, 40, 42, 44 of the selected bit 70, 72 to contribute proportionally to the signal size.

As those skilled in the art will understand, other conformations of the sense strings 20, 22, 24, 26 may be employed without departing from the spirit or scope of the invention. In the four memory spot bit described above, each memory spot, or sub bit 30, 32, 34, 36, 38, 40, 42, 44 is designed to have length to width ratio providing for consistent switching characteristics. In one aspect of the invention, the number of memory spots 30, 32, 34, 36, 38, 40, 42, 44 per bit 70, 72 is designed to provide a selected signal size. In another aspect of the present invention, the number of memory spots 30, 32, 34, 36, 38, 40, 42, 44 per bit 70, 72 is designed to provide redundancy in the event of a defective bit. The defective bit may be the result of a manufacturing defect or operational failure. The MRAM may be advantageously designed to have functional bits with only three of four memory spots operational. In another embodiment, the MRAM may be advantageously designed to have functional bits with only two of three memory spots operational.

In other aspects of the present invention, the multiple memory spots 30, 32, 34, 36, 38, 40, 42, 44 of the bit 70, 72 may be addressed by a single word line 80, 82, 84, 86 to conserve power and allow a higher density of bits 70, 72; or alternatively, multiple word lines 80, 82, 84, 86 may be used to address the multiple memory spots 30, 32, 34, 36, 38, 40, 42, 44 of the bit 70, 72 when more memory spots 30, 32, 34, 36, 38, 40, 42, 44 are desired to obtain a stronger signal to noise ratio or a higher level of redundancy.

In a typical MRAM structure, an array 90 of sense strings includes multiple sense strings 20, 22 positioned adjacent to one another in a linear arrangement. These sense strings 20, 22 have the same general shape, so that the word line 80, 82 may address the sub bits 30, 32, 34, 36, 38, 40, 42, 44 of each sense string in the array 90. In one preferred embodiment, the array 90 includes thirty-three sense strings 20, 22 that may each be addressed by the upper word line 80 and the lower word line 82. As those skilled in the art will understand, the word line 80, 82 may address more or fewer sense strings 20, 22 without departing from the spirit or scope of the present invention. The sub bits 30, 32, 34, 36, 38, 40, 42, 44 of each sense string 20, 22 must be positioned so that a sense current passing through the sub bits 30, 32, 34, 36, 38, 40, 42, 44 is orthogonal to a word current passing through the word line 80, 82.

Each sense string 20, 24 has an input end 100, 102, 104, 106 connected to a voltage source 108 through a switch 110, 112, 114, 116. A transistor may serve as the switch 110, 112, 114, 116. A signal 118 triggers the switch 110, 112, 114, 116 of a selected sense string 20, 22, 24, 26 to allow a sense current to pass through the respective sense string 20, 22, 24, 26. Each sense string 20, 22, 24, 26 also has an output end 120, 122, 124, 126 connected to a sense line 128, 130. In the preferred form, the MRAM segment 10 includes two sense lines, an upper sense line 128 and a lower sense line 130, respectively. The MRAM segment 10 further includes two arrays 90, 92 of sense strings 20, 22, 24, 26, an upper array 90 positioned above the two sense lines 128, 130 and a lower array 92 positioned below the two sense lines 128, 130.

The MRAM segment 10 of the preferred form of the present invention provides for noise stabilization and reduction through the coupling of the respective output ends 120, 122, 124, 126 of the sense strings of the upper array 90 and the lower array 92. In one example embodiment, shown in FIG. 1, the output end 120, 122 of each of the sense strings 20, 22 of the upper array 90 is connected alternately to the upper sense line 128 and the lower sense line 130. Thus, in this example embodiment, sense string 20 is connected to the lower sense line 130, and sense string 22 is connected to the upper sense line 128. Likewise, the output end 120, 122, 124, 126 of each of the sense strings 24, 26 in the lower array 92 is connected alternately to the upper sense line 128 and the lower sense line 130. In this example embodiment, sense string 24 is connected to the upper sense line 128 and sense string 26 is connected to the lower sense line 130. This pattern of coupling the output ends 120, 122, 124, 126 of the sense strings 20, 22, 24, 26 continues for each of the sense strings 20, 22, 24, 26 in the arrays 90, 92. Those skilled in the art will understand that other patterns of coupling the output ends 120, 122, 124, 126 of the sense strings 20, 22, 24, 26 may be employed without departing from the spirit or scope of the present invention.

The upper sense line 128 and the lower sense line 130 provide the signal from the sense strings 20, 22, 24, 26 to a differential amplifier 132. The differential amplifier 132 detects the voltage difference in the signal provided by the upper sense line 128 and the lower sense line 130. Determination of the state of a selected bit makes use of the output of the differential amplifier 132.

Figure 2A:
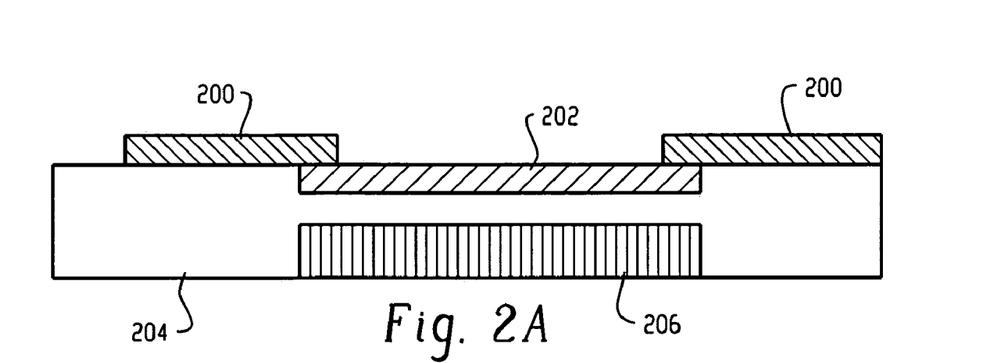
FIG. 2A shows an end view of a sense string and word line, with portions of the MRAM structure removed to show details of the structure of the sense string and word line.
Figure 2B:
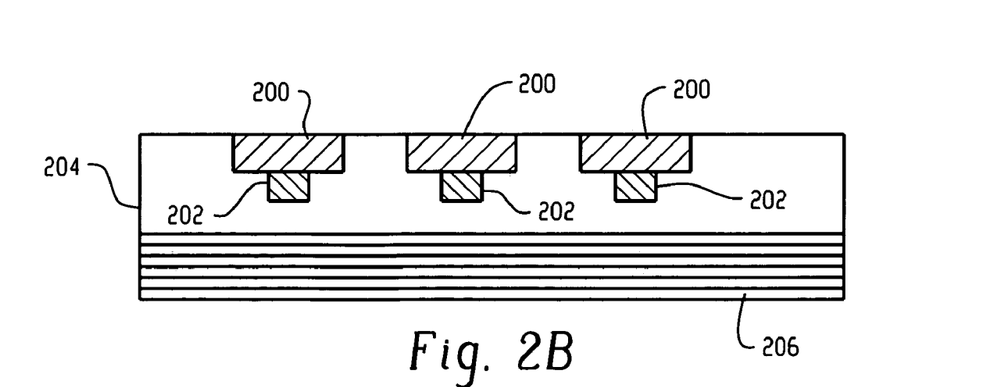
FIG. 2B shows a side view of a sense string and word line, with portions of the MRAM structure removed to show details of the structure of the sense string and word line.

FIGS. 2A and 2B show an end view and a side view, respectively, of a sense string 20, 22, 24, 26 and word line 80, 82, with portions of the MRAM structure removed to show details of the structure of sense string 20, 22, 24, 26 and word line 80, 82. The MRAM segment 10 has a strap layer 200 and a bit layer 202 embedded within a dielectric layer 204. The dielectric layer 204 also serves as an insulating layer 204. The sub bits 30, 32, 34, 36, 38, 40, 42, 44 are formed from sections of the bit layer 202 embedded within the dielectric layer 204. As shown in FIGS. 2A and 2B, the strap layer 200 overlies the bit layer 202. The strap layer 200 provides connection elements between the sub bits 30, 32, 34, 36, 38, 40, 42, 44. Overlap between the strap layer 200 and the sub bits 30, 32, 34, 36, 38, 40, 42, 44 provide contact between the strap layer 200 and the sub bits 30, 32, 34, 36, 38, 40, 42, 44. The word lines 206 are also embedded within the dielectric layer 204, and in the preferred form, the sense strings 20, 22, 24, 26 overlie the word lines 206. The conformation of the word lines 206 and the sense strings 20, 22, 24, 26 become a source of capacitive coupling. Furthermore, in order to present a substantially uniform field to the sub bits 30, 32, 34, 36, 38, 40, 42, 44, the length of the sub bits may be limited to the width of the word lines 206.

The present invention provides for a greater signal differential by employing multiple sub bits 30, 32, 34, 36, 38, 40, 42, 44 for each bit 70, 72. The memory spots for each bit are set to have the same magnetization state. Thus, in a high resistance state, or "0" state, the difference in resistance from a low resistance state, or "1" state, will be proportional to the number of memory spots 30, 32, 34, 36, 38, 40, 42, 44 in a bit 70, 72. In the preferred embodiment, sub bits 30, 32, 34, 36 and sub bits 38, 40, 42, 44 each make up one bit 70, 72, respectively. By connecting these memory spots 30, 32, 34, 36, 38, 40, 42, 44 in series, the example embodiment shown provides a signal having a voltage drop four times the magnitude that would be provided from a single memory spot. More or fewer memory spots or sub bits 30, 32, 34, 36, 38, 40, 42, 44 may be employed for each bit 70, 72 to provide a signal having a desired magnitude.

The present invention also provides for a greater memory capacity by employing multiple groups of sub bits 30, 32, 34, 36, 38, 40, 42, 44 on each sense string 20, 22, 24, 26. Each group of sub bits 30, 32, 34, 36, 38, 40, 42, 44 on the sense string 20, 22, 24, 26 make up a separate bit 70, 72 and has a separate word line 80, 82, 84, 86 so that each group of sub bits 30, 32, 34, 36, 38, 40, 42, 44 may be addressed separately. In the preferred embodiment of the present invention, the upper word line 80 addresses upper sub bits 38, 40, 42, 44 and the lower word line 82 addresses lower sub bits 30, 32, 34, 36. A word current through either word line 80, 82 addresses the respective sub bits while not appreciably changing the resistance of the other sub bits. More or fewer groups of sub bits may be employed without departing from the scope of the present invention.

The MRAM queries the state of a bit using a sense current and a word current. By way of example, and not limitation, determination of the lower bit 72 begins by sending a signal that triggers the switches 110, 114 for the first sense string 20 and the reference sense string 24. This allows a sense current from voltage source 108 to flow through each respective sense string 20, 24. Concurrently, the MRAM applies a word current through the lower word line 82 of the upper array 90. All other sense strings 22, 26 and word lines 80, 84, 86 remain inactive. The magnetic field from the word current change the resistance of the sub bits 30, 32, 34, 36 to the sense current. By way of example, the current through the sense strings 20, 24 can be on the order of 3–5 milliamps and the current passing through the word line 82 can be on the order of 40–50 milliamps. These values are representative and may vary.

In the foregoing example, the lower sense line 130 receives the sense current from the sense string 20 and serves as a reference sense line. A second sense string, reference sense string 24, acts as a reference for sense string 20 and provides a reference signal unaffected by a word current. An upper sense line 128 receives the sense current through sense string 24. In a similar fashion, when the MRAM segment 10 addresses a bit on sense string 24, sense string 20 may serve as a reference. The differential amplifier 132 samples the signals from the upper sense line 128 and the lower sense line 130. The differential amp 132 includes circuitry to employ an auto zero technique that locks in the difference of the signals from the upper sense line 128 and the lower sense line 130 as a base value. The current on the word line 82 is then reversed, causing the resistance of the memory spots 30, 32, 34, 36 to change because of the change of the magnetic field generated by the word line 82. The differential amplifier 132 then samples the signals from the upper sense line 128 and the lower sense line 130 again and provides the results to a comparator. The differential amplifier 132 further includes a comparator to determine the state of the lower bit 72.

In the foregoing example, the differential amplifier 132 receives a signal from the sense string 20 on the lower sense line 130 and a signal from reference sense string 24 on upper sense line 128. However, in addition to the signal from the sense current passing through the sense string 20, the current from the word line 82 has a capacitive interconnect with the sense string 20 and each of the sense strings 22 in the same array as the sense string 20. The capacitive interconnects generate a significant amount of noise in comparison to a bit component of the signal from the sense string, comprising up to fifty percent of the bit component. Furthermore, the noise generated by the capacitive interconnects between the word line 82 and the sense strings 20, 22, 24, 26 vary between each sensing event. Also, the noise is proportional to the number of sense strings 20, 22 in the array 90. Thus, as the array size increases, the amount of noise due to capacitive interconnects increases proportionally. These noise levels are a major impediment to development of fast and reliable MRAM applications. With increasing MRAM array sizes, these hindrances are exacerbated.

The MRAM segment 10 according to the preferred teachings of the present invention stabilizes and reduces noise generated by these capacitive interconnects. By coupling a first portion of each array 90 of sense strings to the upper sense line 128 and a second portion of each array 90 of sense strings 20, 22, 24, 26 to the lower sense line 130, the MRAM segment 10 reduces the amount of noise seen by each sense line 128, 130 proportional to the portion of sense strings 20, 22, 24, 26 coupled to the other sense line 128, 130. In the preferred embodiment, alternating sense strings 20, 22, 24, 26 in an array 90, 92 are coupled the upper sense line 128 and the lower sense line 130, respectively, reducing the amount of noise from capacitive coupling by approximately fifty percent. MRAM segment 10 according to the preferred teachings of the present invention also stabilizes the effect of noise through cross coupling of the sense strings 20, 22, 24, 26. The cross coupling of the sense strings 20, 22, 24, 26 balances the noise generated in the sense strings 20, 22, 24, 26 by activation of the word line 80, 82 between the upper sense line 128 and the lower sense line 130.

Figure 3:
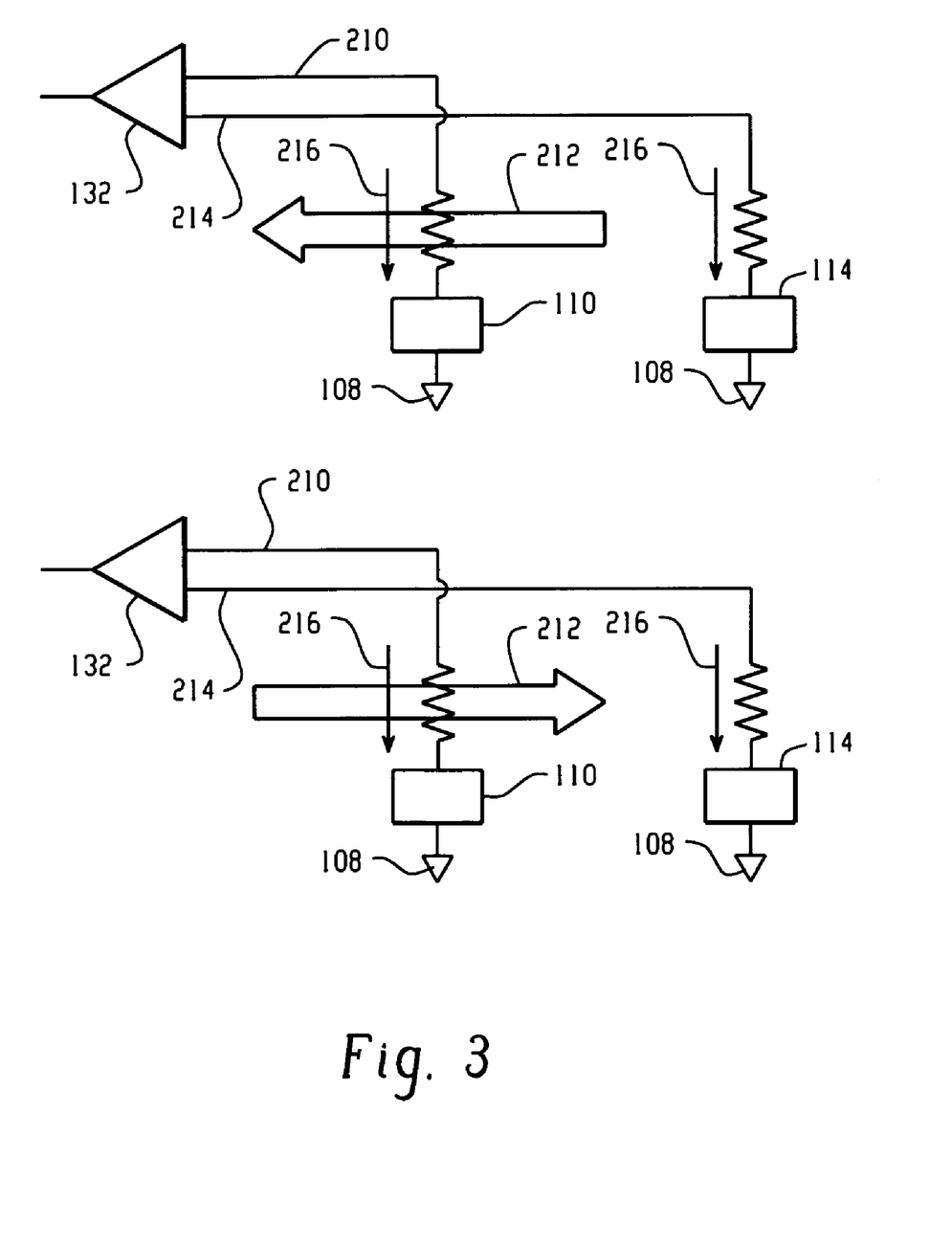
FIG. 3 shows a simplified circuit seen by the differential amplifier utilizing preferred methods according to the preferred teachings of the present invention with a sense string and a word line active.

FIG. 3 shows a simplified circuit seen by differential amplifier 132 with the sense string 20 and the word line 82 active. At one input, the differential amplifier 132 receives the sense signal 210 from a sense string 20 having an active word line 82 with a word current 212. The other input receives a reference signal 214 from the reference sense string 24. Both the sense signal 210 and the reference signal 214 include a sense current 216 and a noise current injected by the capacitive coupling. The difference seen by the differential amplifier 132 is now largely due to the different voltage drop across the sense string 20 with the active word line 82 because of the different resistance to the sense current 216. A second signal can be obtained by reversing the word current 212.

Figure 4:
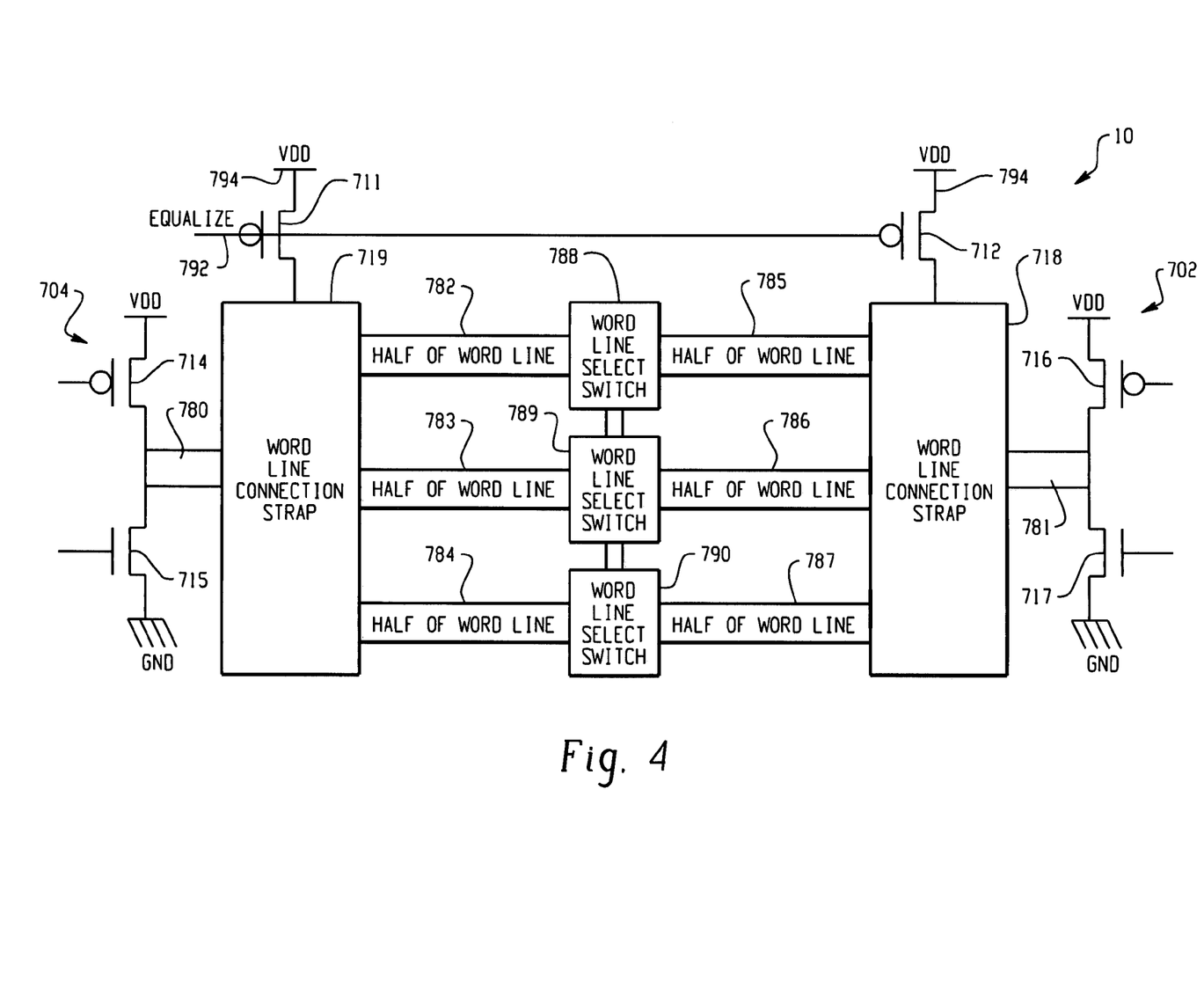
FIG. 4 shows a top view of a word driver and word line arrangement with equalization circuitry according to the preferred teachings of the present invention.

Refer now to FIG. 4 that shows an MRAM according to the preferred teachings of the present invention is shown in the drawings and generally designated 10. The equalize signal 792 controls the gate of transistor 711 and transistor 712. The drains of transistors 711 and 712 are connected to VDD 794, respectively, and their sources are connected to word line connection strap 719 and word line connection strap 718, respectively.

Word line half 782 is connected at one end to word line connection strap 719, and at a second end to word line select switch 788. Word line half 783 is connected at one end to word line connection strap 719 and at a second end to word line select switch 789. Word line half 784 is connected at one end to the word line connection strap 719 and at second end to word line select switch 790. The word line connection strap 719 is connected to the drain of transistor 714 and the drain of transistor 715 by line 780.

Word line half 785 is connected at one end to word line connection strap 718 and at a second end to word line select switch 788. Word line half 786 is connected at one end to word line connection strap 718 and at a second end to word line select switch 789. Word line half 787 is connected at one end to the word line connection strap 718 and at a second end to word line select switch 790. The word line connection strap 718 is connected to the drain of transistor 716 and drain of transistor 717 by line 781. In one example embody sent transistor 714, 716 represents transistor 830. In one example embodiment transistor 715, 717 represent transistor 843.

MRAM word lines in general and half word lines, 782, 783, 784, 785, 786 and 787 have relatively large capacitance and carry large currents that switch in a short time period. The half word lines 782–787 are isolated from each other prior to operation. The two sides of the word line structure are isolated and have different potentials when a word line is selected at the beginning of a read or write cycle.

To avoid having an uncontrolled write at the beginning of a read or write cycle a device to equalize word line capacitances is installed. In one example embodiment according to the preferred teachings of the present invention, the device is a set of P-channel transistors 711 and 712 connecting both sides of the word line to VDD 794. Since VDD 794 is common to both sides, any chance of having a switching pulse is avoided when the two sides are connected.

The common reference point is chosen to be VDD 794 in this case, but it could also be VSS or any point between VDD or VSS. According to the preferred teachings of the present invention, a P-channel transistor was chosen as the device to achieve the equalizing, but an N-channel transistor could also be used. The equalization device could also be a combination of these.

The equalization transistors 711 and 712 are connected to the shorting bars 719 and 718, respectively, on the right and left end of the word lines. Both of these p-channel transistors 711 and 712 are controlled by the same equalization signal 792 so they both turn on and off at the same time. The equalization transistors 711 and 712 equalize the voltage on either side of the word decode switches 788, 789, and 790 prior to the start of the read or write cycle. This results in a reduction in undesirable current surges which, in turn, results in a greater degree of control of the read and write current and hence the read and write magnetic fields. The equalization method results in a more stable read and write cycle. The equalization transistors 711 and 712 assure that both sides of an MRAM 10 word line are referenced to the same point prior to switching. The MRAM 10 word line therefore has equal charge potential on both sides.

Figure 5A:
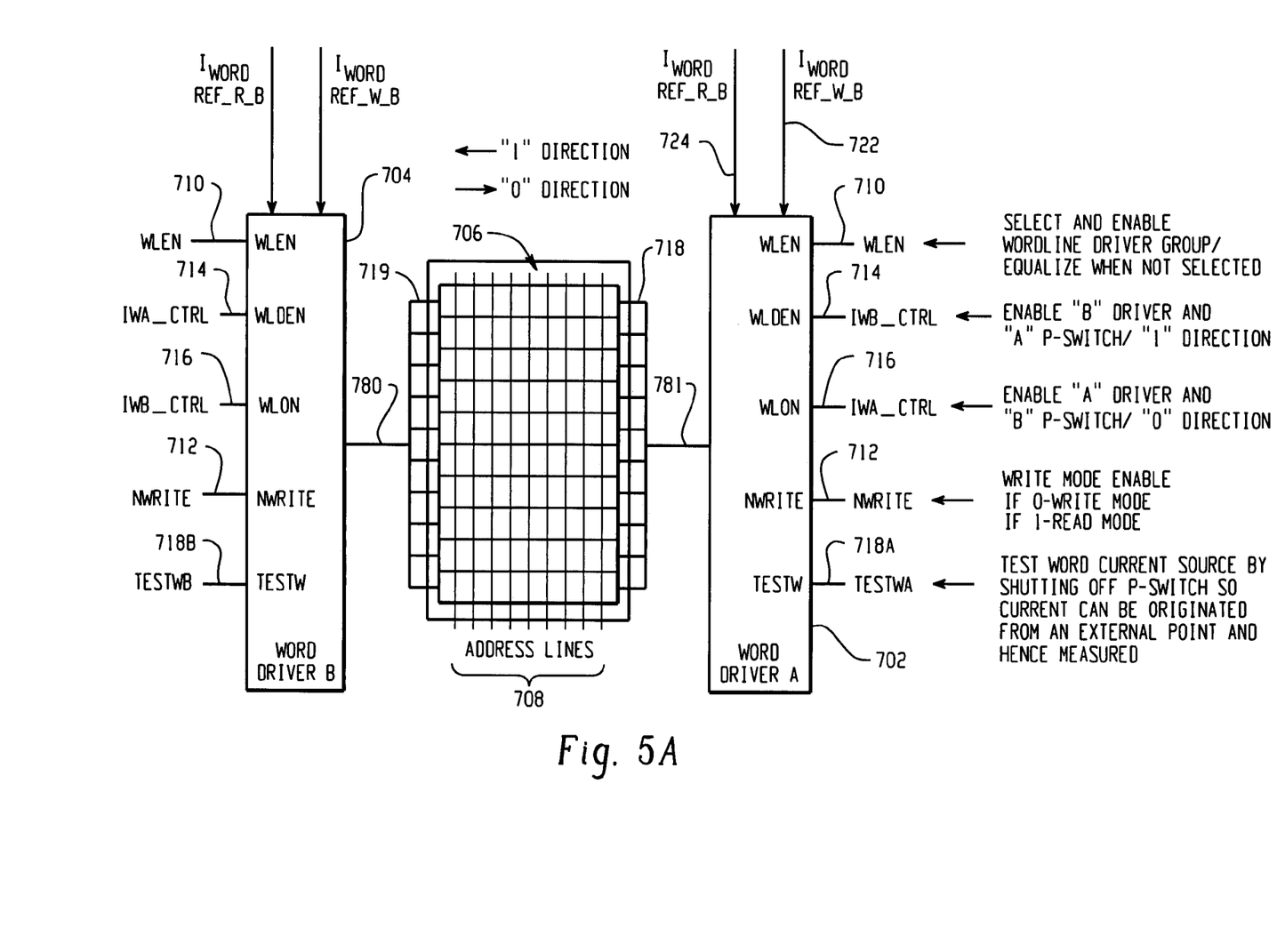
FIGS. 5A and 5B show a circuit schematic and a timing diagram of different phases of word driver circuit performance showing operational levels according to the preferred teachings of the present invention.
Figure 5B:
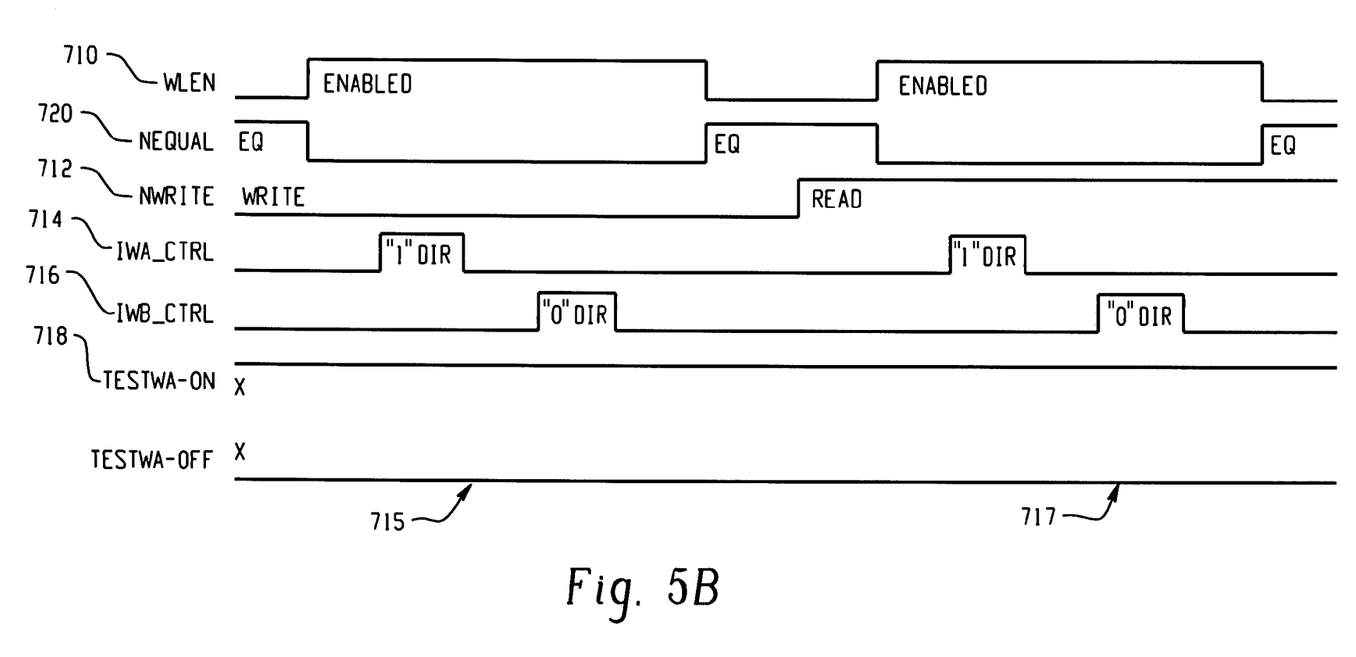

Refer now to FIGS. 5A and 5B which show a circuit schematic and timing diagram illustrating the operation of the various control signals according to the preferred teachings of the present invention. There are two line word drivers: a word line driver A 702 and a word line driver B 704. Both of these drivers are identical circuits, but one is on one end of the word line set 780 and one is on the other end of the word line set 781. The word line driver A 702 is controlled independently of the word line driver B 704. The word line driver A 702 is connected to word current references Ira 722 and Iwa 724. Ira 122 is the word current reference for write operations and may be in the range of 100–300 microamps. Iwa 724 is the word current reference for read operations and may be in the range of 50–150 microamps.

A word decoder 706 that connects the left end of a word line to the right end of a word line showing is shown connecting ten word lines for simplicity. According to the preferred aspects of the invention, sixty-four word lines are connectable and addressed by six address lines 708. Word line driver A 702 and word line driver B 704 drive a selected word line using a single large transistor. Only one of the word lines are going to be active at a time because only one of the word lines is going to be connected from the left to the right while all other word lines are disconnected. The selected word half line is shorted to its partner half word line, and that activates the selected word line by allowing current to flow only through that word line.

By convention, word current going to the left is the "1" direction and going to the right is the "0" direction. WLEN signal 710 is the word line enable signal that enables the whole group when the MRAM includes several groups of word lines. The WLEN signal 710 heralds the activation of this particular group by decode among groups of word line sets. Nwrite signal 712 determines whether the MRAM is in write mode or read mode. This selects the current on these drivers. The nwrite signal 712 is acitve in write mode and is also active in the read mode.

The word line enable signal, the WLDEN signal 710 enables the particular driver, either A or B, to be active. The TestWA 718A is used to test the magnitude of the word driver for word line driver 704. The TestWB 718B is used to test magnitude of the word line driver A 702. For example, when the TestWA 718A is active or high, according to the preferred teachings of the present invention, the P-channel in word line driver 702 is disabled by applying TestWA 718A to TestW 826, shown in FIG. 7, so that an external supply enables the direct measurement of current being pulled in through the drivers, for example 843 shown on FIG. 7.

The WLEN signal 710 is high active and indicates that the word driver is enabled. The NEQUAL signal 720 is high active and indicates that the word lines equalization is enabled. The NWRITE signal 712 is high active and indicates that the MRAM is in the read mode. The IWA_CTRL signal 714 is high active and connected to cause the word line driver A 702 to drive current in the word lines in the '1' direction. The IWB_CTRL signal 716 is high active and is connected to cause the word line driver B 704 to drive current in the word lines in the '0' direction.

Refer now to FIG. 5A, which shows schematic diagram of a plurality of address lines 708 with a plurality of word line decoders 706. A word line driver A 702 and a word line driver B 704 are connected to drive a word line selected by the address lines 708.

The operation of the word line driver A 702 illustrates the control features according to the preferred teachings of the invention. The WLEN signal 710 is the word line enable signal. An activation of the WLEN signal 710 enables the set of the word line addresses 708 pertaining to the word line driver A 702 and the word line driver B 704 that are also enabled. The IWB_CTRL signal 716 and the IWA_CTRL signal 714 determine the direction of current on the selected word line. The IWB_CTRL signal 716 drives the WLDEN input on the word line driver A 702 and the IWA_CTRL drives the WLON signal on the word line driver A 702. The IWB_CTRL signal 716 drives the WLON input on the word line driver B 704 and the IWA_CTRL drives the WLDEN signal on the word line driver B 704. The word line driver A 702 and the word line driver B 704 are identical circuits so the WLDEN and WLON connections ensure that only one driver will be enabled any one time because either IBA_CTRL signal 716 is active or the IWB_CTRL signal 714 is active at a time.

According to the preferred teachings of the present invention, the IWB_CTRL signal 716 enables the word line driver B 704 P channel switch for a read or write operation in the '1' direction and the IWA_CTRL signal 714 enables the word line driver A 702 P channel switch for a read or write operation in the '0' direction. The NWRITE signal 712 determines the magnitude of the current and implements either a read operation or a write operation in the MRAM 10. According to the preferred teachings of the present invention, a '0' state indicates the MRAM is in a write mode and a '1' state indicates that the MRAM is in a read mode. The word line driver A 702 and the word line driver B 704 include a TESTWA signal 718A and a TESTWB signal 718B that allow the direct provision of current to the word line of chip and thus the direct monitoring of current off chip. The TESTWA signal 718A and the TESTWB signal 718B enable the testing of the word current source by shutting of the P channel transistor in the word driver circuitry, shown in greater detail with reference to FIG. 7.

Refer now to FIG. 5B, which shows a timing diagram of the control signals according to the preferred teachings of the present invention. The WLEN signal 710 is the word line enable signal. When WLEN is high active indicating that the word line is enabled. FIG. 5B shows two clock cycles of operation. The NWRITE signal 712 is the read/not write signal. In the first cycle, the NWRITE signal 712 is low indicating a write operation. In the second cycle, the NWRITE signal 712 is high indicating a read operation. The NEQUAL signal 720 is the equalization signal. When the word line is enabled, indicated by the WLEN signal 710 being high, the NEQUAL signal is low indicating that the circuit is not equalizing. When the word line is not enabled, indicated by the WLEN signal 710 being low, the NEQUAL signal 720 is high indicating that the circuit is equalizing. FIG. 5B shows that the circuit is equalizing right at the beginning before the memory cycle and not equalizing when in a memory cycle. FIG. 5B also shows that the circuit is equalizing between the write and the read cycle and then again at the end after the read cycle ends.

The IWA_CTRL signal 714 controls the 1 direction of the circuit, in other words, enables the 1 direction on the word line drivers. So, for both the write and the read version of the cycle, IWA_CTRL goes high, and then low, separated by a break in time. The IWB_CTRL signal 716 controls the 0 direction of the circuit, in other words, enables the 0 direction on the word line drivers. So, for both the write and the read version of the cycle, IWB_CTRL goes high, and then low, separated by a break in time.

Figure 6A:
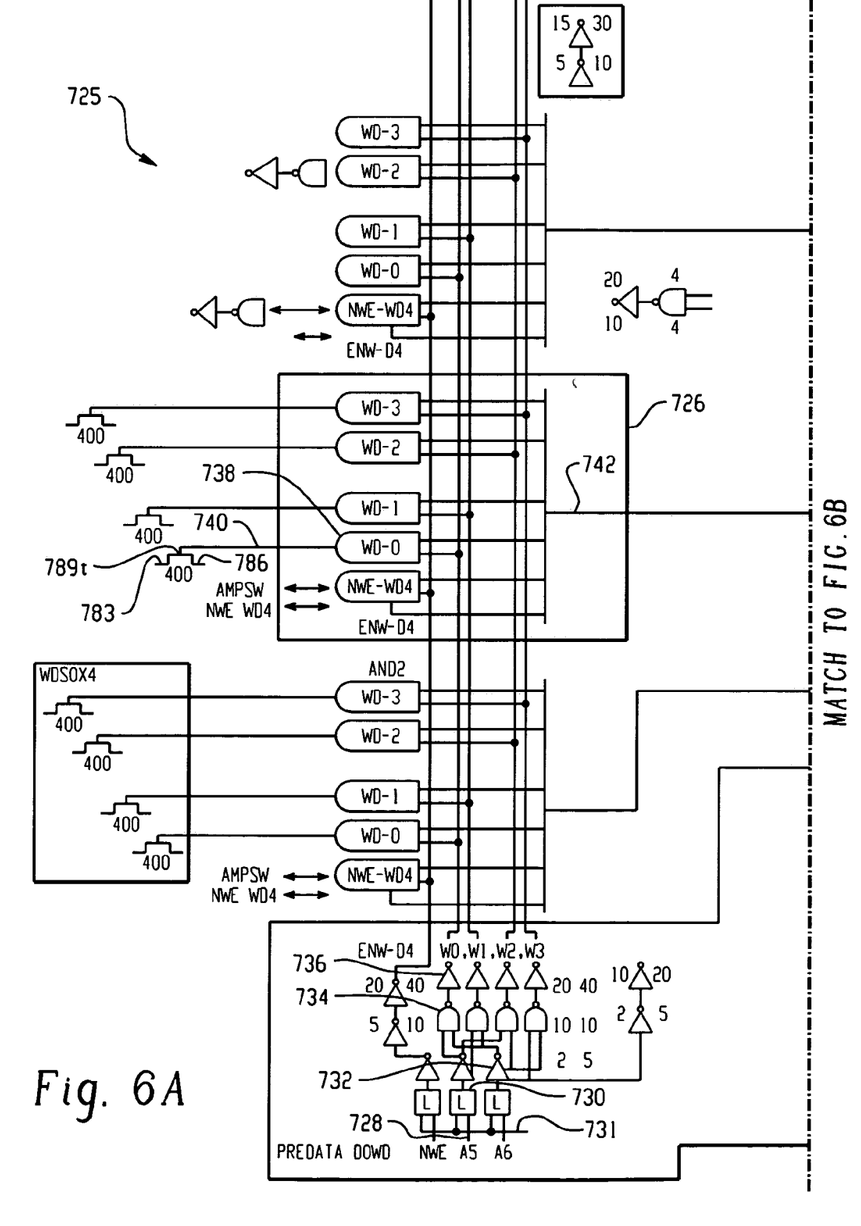
FIG. 6 shows a decode of a 8k memory block with word and SD switch select according to the preferred teachings of the present invention.
Figure 6B:
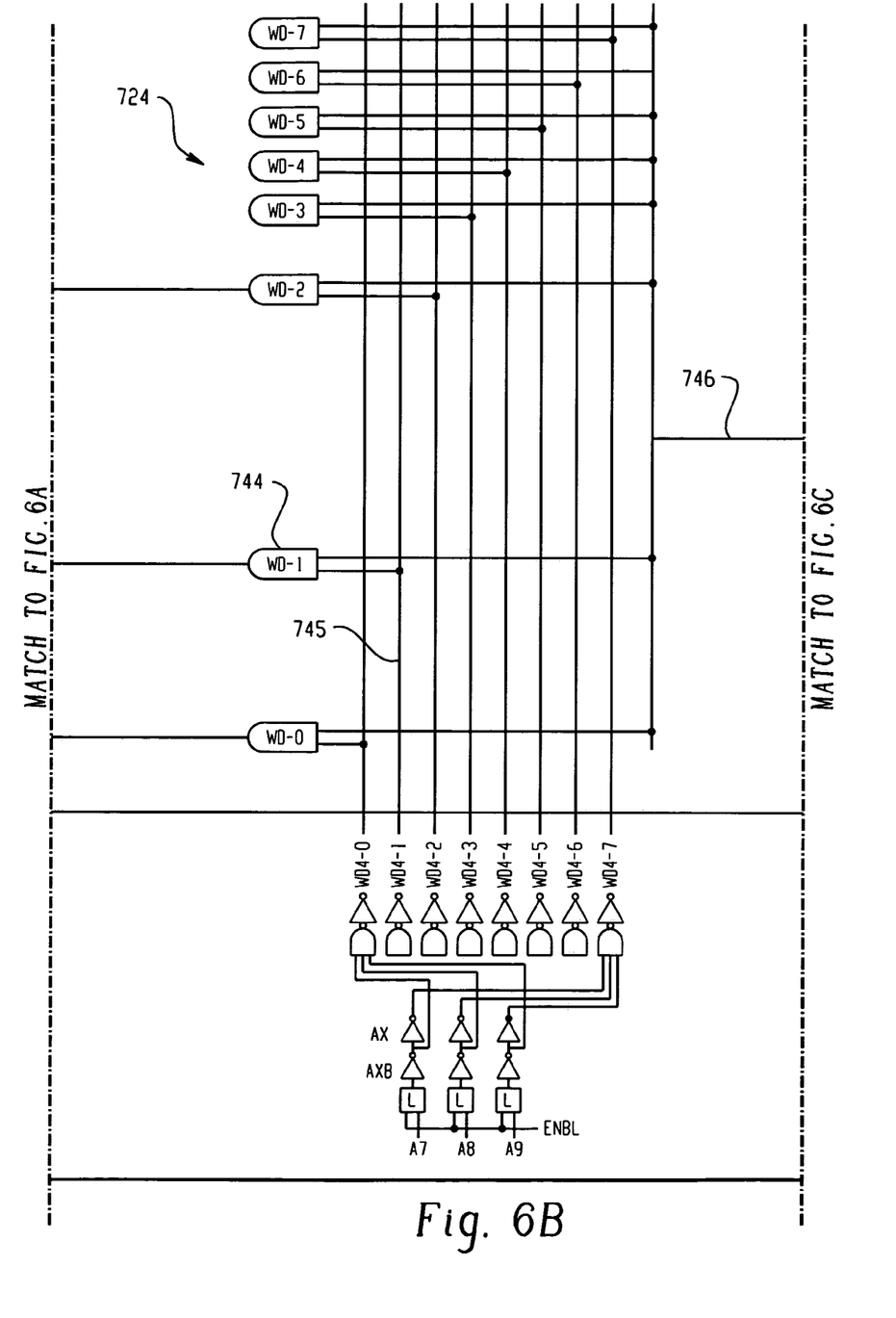
Figure 6C:
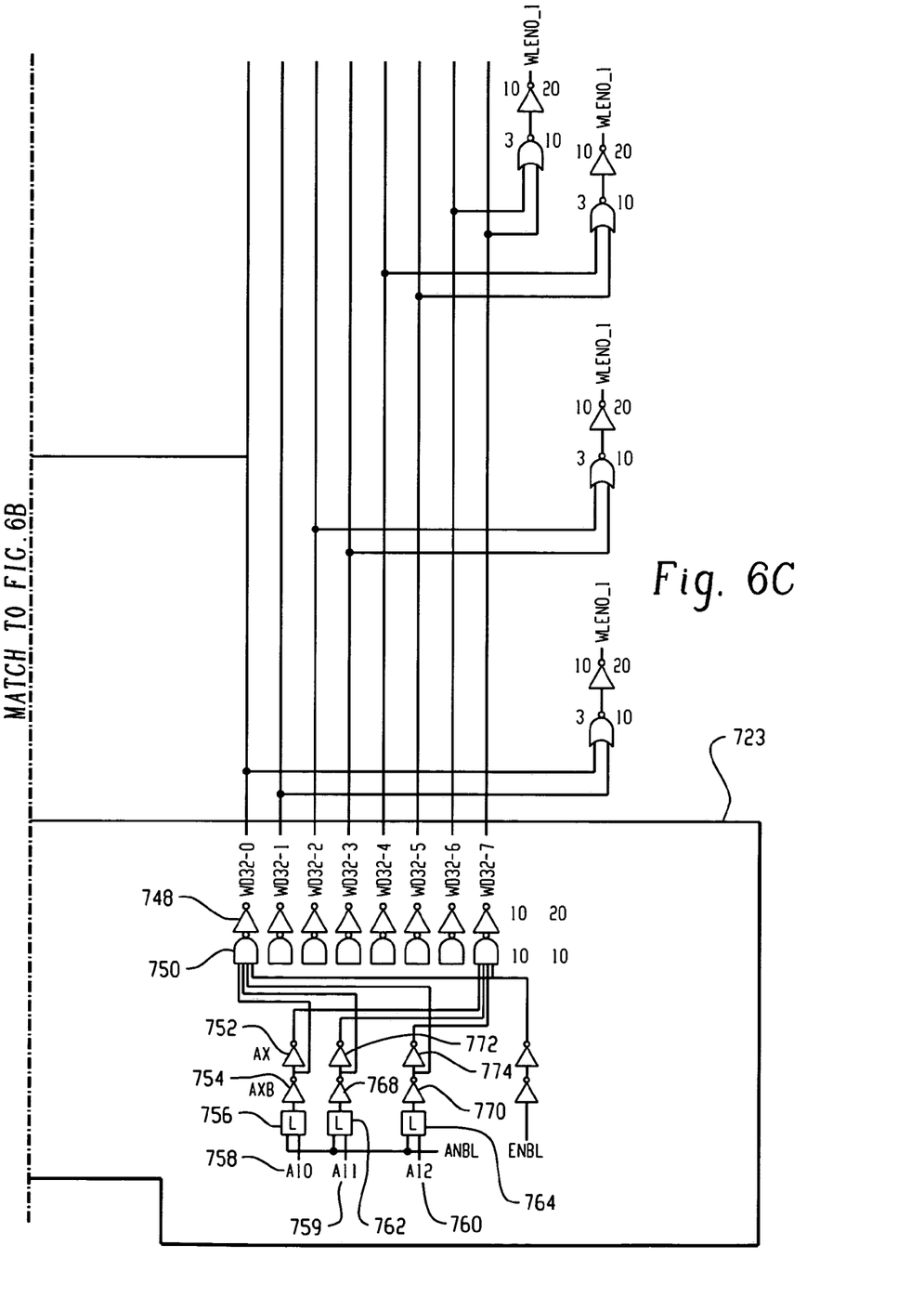

Refer now to FIG. 6 that shows a decoder 725 for the decode of an address for an 8K block of memory such as an 8K block of MRAM. The decoder 725 has a number of functional blocks. The pre-decoder 723 provides a first stage of logic that decodes the address lines that address the 8K block of memory. By way of example and not limitation, the decode and activation of a word line transistor 789t will be traced back to the address lines effecting its actuation. Those skilled in the art will understand that the remaining lines have a similar decode structure, varying according to their particular active address. The word line transistor 789t will activate only one word line in this block following an address decode scheme that allows the unique addressing of a word line select switch 789. The word line select switch 788 is a transistor with a 400 micron gate. This large transistor allows the switching of large amount of current. The word line transistor 789t operates as a transmission gate allowing the flow of current in both the "1" and "0" directions. The gate of word line transistor 789t is controlled by gate control signal 740 that is the output of AND 738. The AND 738 has as an input the output of AND 744 signal 742. AND 738 also has a decoded signal from inverter 736 that is the result of the NAND 734 of an inverter signal 732 and a latch signal 730. The latch signal 730 connects to an enable signal 731 and an address A5 signal 728.

AND 744 decodes the word $_{4-1}$ segment 726. The word 4-1 segment 726 is a representative sample of the word decode block that selects one of the four in the group. The signal 742 is the AND 744 of the address signal 746 from inverter 748 and the address signal 745. Inverter 748 inverts the NAND signal 750 which is the NAND of address signals A10 758, A11 759, and A12 760. The A12 signal 760 is latched by latch 764 which drives inverter 770 that drives inverter 774 that in turn provides the NAND 750 with one of the signals from invertors 752, 772 and 774. Address signal A11 759 drives to latch 762 which provides a signal to inverter 768 that drives inverter 772, which in turn provides an output to NAND 750. Address A10 signal 758 provides a signal to latch 756 that drives inverter 754 that drives inverter 752, that in turn provides a signal to inverter 752. The output of inverter 754 is sent to NAND 750. The inverter 748 drives the address signal 746. A similar structure provides the address decode for the AND 744 for address signal 745. AND 744 ands address signal 746 with address signal 745. AND 738 receives the decoded signal from the NAND 734 and inverter 736. The enable signal 731 also is sent to latches 756, 762, and 764. The decoder 725 enables the addressing of an 8K block of memory by activating the appropriate word line select switch.

Figure 7:
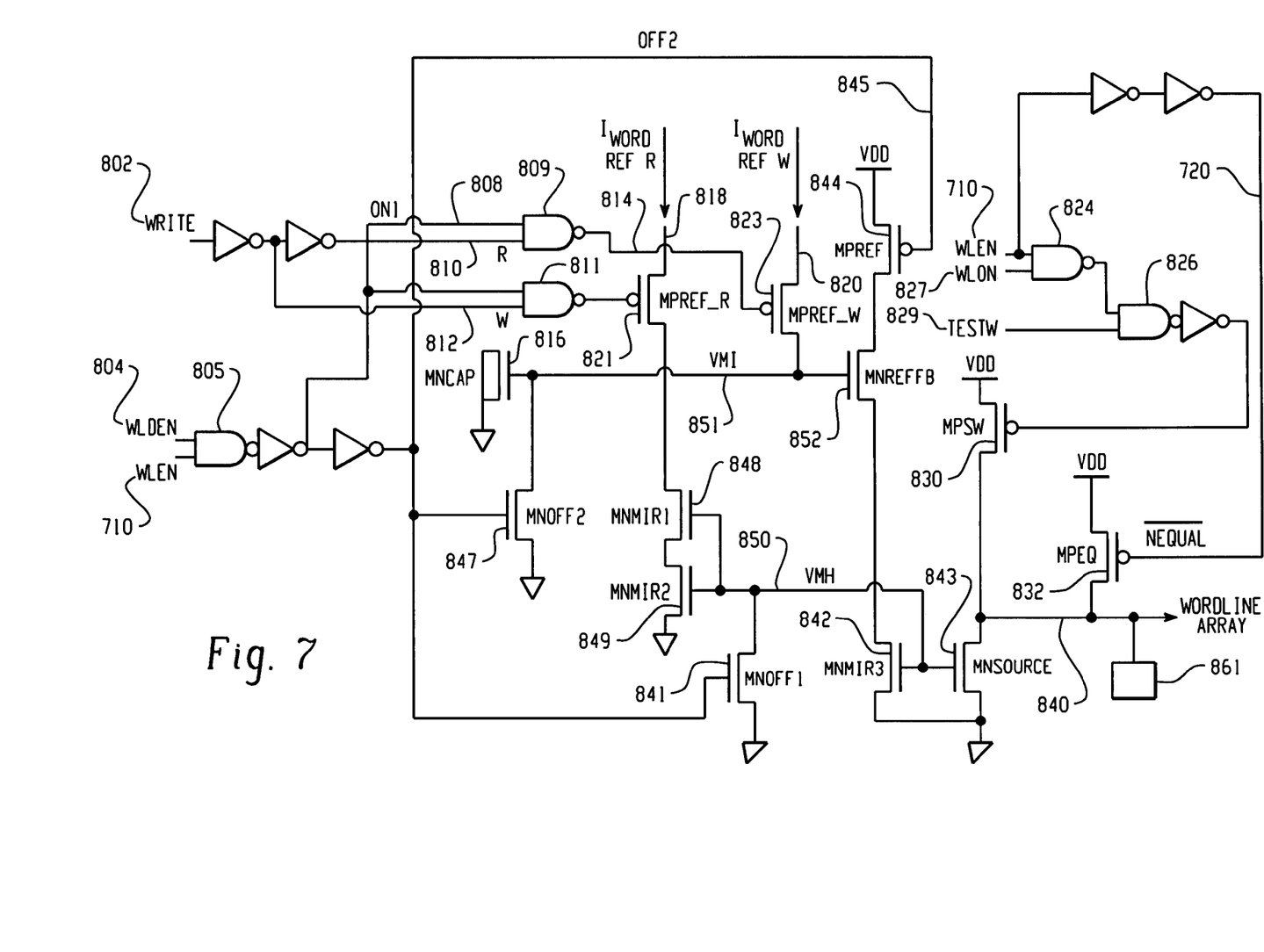
FIG. 7 shows a schematic diagram of the word current driver with a word line array output according to the preferred teachings of the present invention.

Refer now to drawing 7 that shows the word drive circuitry with its associated controls and features. A write signal 802 is buffered and provided to NAND 809. The write signal 802 is the inversion of the Nwrite signal 712. The inverted version of write signal 802 is provided to NAND 811. A WLEN signal 710 and WLDEN enable signal 804 are provided to NAND 805. The WLDEN signal 804 indicates what direction, either a read direction or write direction, the word line current 840 is driven. The output of NAND 805 is inverted and provided to NAND 809 as On1 signal 808. The On1 signal 808 is provided to a NAND 811 also. Signal 810 is also provided to NAND 809. The signal 810 is a buffered write 802 signal. NAND 809 provides the enable signal 814 to the gate of P-channel transistor 823. Transistor 823 enables word reference write current 820 input and provides the VMI signal 851 when enabled.

The On1 signal 808 is inverted to generate the OFF2 signal 845. NAND 811 controls the gate of P-channel transistor 821 and has a signal 812 input that is the inversion of the write signal 802. Transistor 821 enables word reference read current 818 input and provides the VMI signal 851 when enabled. The OFF2 signal 845 is provided to the gate of transistor 847 and MNOFF1 transistor 841. The MNOFF1 provides for rapid shutoff cutting the word line current 840.

Capacitor 846 is connected to the VMI signal 851 as well as the MNOFF2 transistor 847. The gate of MNOFF2 transistor 847 is controlled by the Off2 signal 845. The Off2 signal 845 also controls the gate of the MPREF transistor 844.

The VMI signal 851 is connected to control the gate of MNREFB 852. MNREFB 852 is connected to the MPREF transistor 844 and the MNMIR3 transistor 842. The MNMIR3 842 transistor is connected in a mirror configuration to MNSOURCE transistor 843. The MNSOURCE transistor 843 is one example embodiment according to the preferred teachings of the present invention of transistor 715 or transistor 717. The MNMIR1 transistor 848 is connected to the VMI signal 851 and its gate is controlled by the VMH signal 850. The MNMIR2 transistor 849 is connected to the MNMIR2 848 transistor and is gate controlled by the VMH signal 850 as well.

The MPEQ transistor 832 is gate controlled by the NEQUAL' signal 720. The MPEQ transistor 832 is one example embodiment according to the preferred teachings of the present invention of transistor 711 and transistor 712. The MPEQ transistor 832 drives the word line array through the word line drive signal 840. The MNSOURCE transistor 843 also drives the word line drive signal 840. The NEQUAL' signal 720 is generated by a double inverted drive combination from the WLEN signal 710. This is configured for the P-channel MPEQ transistor 832. The control for the MPSW switch transistor 830 takes into account the enable circuitry, and signals WLEN signal 710 and WLON signal 827 as well as the disable function provided by central signal TestW 829 and its circuitry. The control signal TestW 829 is one example embodiment according to the preferred teachings of the present invention of control test signal TestWA 718A and control signal TestWB 718B. The MPSW transistor 830 is one example embodiment according to the preferred teachings of the present invention of the transistor 716 or transistor 714. When the TestW 829 is forced high to VDD, the function of p-channel transistor MPSW 830 can be supplied by an external connection or pad 861 connected to the word line current Iwrd 840. By observing the current or voltage on this external connection, the actual word line current Iwrd 840 can be measured and observed for magnitude and overshoot conditions.

The output of nor 826 is inverted and provided to the gate of the MPSW transistor 830. Nor 826 nors the TESTW signal 829 with the output of the nanding 824 of the WLEN signal 760 and the word line on control WLON signal 827.

The control of p-channel transistor MPSW 830 includes the TestW signal 829 and WLON signal 827 options. They allow for on and off control of p-channel transistor MPSW 830 independent of the control of the n-channel transistor MNSOURCE 843 and its controlling circuitry. The controlling circuitry of the n-channel transistor MNSOURCE 843 is shown in FIG. 7.

The independent control WLON signal 827 to NAND 824 allows the p-channel transistor 830 to be turned on or off at a different time than n-channel transistor 843. With this feature, the p-channel transistor MPSW 830 could be turned on prior to the n-channel transistor MNSOURCE 843. When this is done, current surges from switching can be reduced or regulated, because switching is then controlled by the n-channel transistor MNSOURCE 843.

The TestW signal 829 that controls the nor 826 is the feature that allows an independent disable of p-channel transistor MPSW 830. This is independent of the normal function of the MRAM 10. During normal operation, the TestW signal 829 is held low and is disabled. When the TestW signal 829 is forced high to VDD, the function of p-channel transistor MPSW 830 can be supplied by an external connection or pad connected to the word line array attached to current 840. By observing the current or voltage on this external connection, the actual word line current 840 can be measured and observed for magnitude and overshoot conditions.

Thus since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than by the foregoing description, and all changes which come within the meaning and range of equivalency of the claims are intended to be embraced therein.

What is claimed is:

1. A magnetic random access memory comprising, in combination:
   a plurality of magnetic memory elements that perform a memory operation;
   a word line to magnetically activate at least one magnetic memory element;
   a sense line to detect the state of the at least one magnetic memory element;

a word line driver connected to the word line to drive a current on the word line during the memory operation; and a word line equalizer connected to the word line to equalize the word line during non-memory operations;

wherein the word line driver comprises, in combination;

a first transistor with a gate connected to an equalize signal and a first terminal connected to a power supply and a second terminal connected to a first end of the word line;

a second transistor connected to a second end of the word line, with the first transistor cooperating with the second transistor to drive current on the word line when the equalize signal is inactive; and an equalizer transistor connected to provide a equalization signal to the word line when the equalize signal is active.

2. The magnetic random access memory of claim 1 with the memory operation being a read operation.

3. The magnetic random access memory of claim 1 with the memory operation being a write operation.

4. The magnetic random access memory of claim 1 with the word line having a first half word line and a second half word line, with a word line select switch connected between the first half word line and the second half word line.

5. The magnetic random access memory of claim 1 further comprising, in combination: a plurality of word lines.

6. The magnetic random access memory of claim 1 further comprising, in combination: a plurality of word lines, each one of the plurality of word lines having a first half word line and a second half word line, with the first half word line and the second half word line connected to a word line select switch that selects at least one of the plurality of word lines.

7. The magnetic random access memory of claim 1 further comprising, in combination: a word line controller that enables the word line equalizer in response to a word line enable signal.

8. The magnetic random access memory of claim 1 further comprising, in combination:

a plurality of word lines; and an address bus to select the magnetic memory element with one of the plurality of word lines and the address bus.

9. A magnetic random access memory comprising, in combination:

a plurality of magnetic memory elements that perform a memory operation;

a word line to magnetically activate at least one magnetic memory element;

a sense line to detect the state of the at least one magnetic memory element;

a word line driver connected to the word line to drive a current on the word line during the memory operation; and a word line equalizer connected to the word line to equalize the word line during non-memory operations;

the word line driver further comprising, in combination;

a logic controller having a read/write input, an enable input, and a read enable output and a write enable output; and a feedback amplifier having a sense reference read signal input, a sense reference write signal input, a word line signal input, and a word line driver signal output, with the feedback amplifier providing current to the word line in response to the read enable output and the write enable output.

10. The magnetic random access memory of claim 9 with the current in the word line being a '1' direction.

11. The magnetic random access memory of claim 9 with the current in the word line being in a '0' direction.

12. The magnetic random access memory of claim 9 with the current in the word line being controlled during MRAM testing.

* * * * *